(12) United States Patent
Sikka et al.

(10) Patent No.: US 10,636,746 B2
(45) Date of Patent: Apr. 28, 2020

(54) METHOD OF FORMING AN ELECTRONIC PACKAGE

(71) Applicant: INTERNATIONAL BUSINESS MACHINES CORPORATION, Armonk, NY (US)

(72) Inventors: Kamal K. Sikka, Poughkeepsie, NY (US); Krishna R. Tunga, Wappingers Falls, NY (US); Hilton T. Toy, Hopewell Junction, NY (US); Thomas Weiss, Poughkeepsie, NY (US); Shidong Li, Poughkeepsie, NY (US); Sushumna Iruvanti, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/904,556

(22) Filed: Feb. 26, 2018

(65) Prior Publication Data

US 2019/0267332 A1 Aug. 29, 2019

(51) Int. Cl.
*H01L 23/00* (2006.01)
*H01L 23/498* (2006.01)
(Continued)

(52) U.S. Cl.
CPC ........ *H01L 23/562* (2013.01); *H01L 21/0274* (2013.01); *H01L 21/4846* (2013.01); *H01L 23/49827* (2013.01); *H01L 23/49838* (2013.01); *H01L 23/49866* (2013.01); *H05K 3/303* (2013.01); *H01L 24/13* (2013.01); *H01L 24/16* (2013.01); *H01L 24/29* (2013.01); *H01L 24/32* (2013.01); *H01L 24/73* (2013.01); *H01L 2224/13101* (2013.01); *H01L 2224/16225* (2013.01); *H01L 2224/2919* (2013.01);
(Continued)

(58) Field of Classification Search
CPC ... H01L 23/14; H01L 23/498; H01L 21/0274; H01L 21/4846; H01L 23/49827; H01L 23/49838; H01L 23/49866; H01L 23/562; H01L 24/16; H01L 24/32; H01L 24/73; H01L 2224/16225; H01L 2224/73204; H01L 2924/3511; H05K 3/303
See application file for complete search history.

(56) References Cited

U.S. PATENT DOCUMENTS 6,387,830 B1 5/2002 Blumberg et al.
6,703,704 B1 3/2004 Alcoe et al.
(Continued)

FOREIGN PATENT DOCUMENTS

WO 1998020547 A1 * 5/1998

OTHER PUBLICATIONS

Kamal K. Sikka et al., "Method of Making an Electronic Package," U.S. Appl. No. 16/575,549, filed Sep. 19, 2019.
(Continued)

*Primary Examiner* — Carl J Arbes
(74) *Attorney, Agent, or Firm* — Cantor Colburn LLP; Alvin Borromeo

(57) ABSTRACT

A technique relates to an electronic package. A substrate is configured to receive a chip. A stiffener is attached to the substrate. The stiffener includes a core material with a first material formed on opposing sides of the core material.

12 Claims, 9 Drawing Sheets

(51) Int. Cl.
*H01L 21/48* (2006.01)
*H01L 21/027* (2006.01)
*H05K 3/30* (2006.01)

(52) U.S. Cl.
CPC ............... *H01L 2224/32225* (2013.01); *H01L 2224/73204* (2013.01); *H01L 2224/81815* (2013.01); *H01L 2924/171* (2013.01); *H01L 2924/3511* (2013.01)

(56) References Cited

U.S. PATENT DOCUMENTS

| | | |
|---|---|---|
| 7,094,975 B2 | 8/2006 | Chengalva et al. |
| 7,459,782 B1 | 12/2008 | Li |
| 8,216,887 B2 | 7/2012 | Heng et al. |
| 8,455,991 B2 | 6/2013 | Hsiao et al. |
| 8,986,806 B1 | 3/2015 | Baloglu et al. |
| 2004/0150118 A1 | 8/2004 | Honda |
| 2008/0099910 A1 | 5/2008 | McLellan et al. |
| 2009/0116201 A1 | 5/2009 | Hsieh |
| 2010/0073894 A1 | 3/2010 | Mortensen et al. |
| 2012/0235303 A1 | 9/2012 | Liu et al. |
| 2013/0003319 A1 | 1/2013 | Malatkar et al. |
| 2014/0131877 A1 | 5/2014 | Chen |

OTHER PUBLICATIONS

List of IBM Patents or Patent Applications Treated as Related; (Appendix P); filed Sep. 19, 2019, 2 pages.

\* cited by examiner

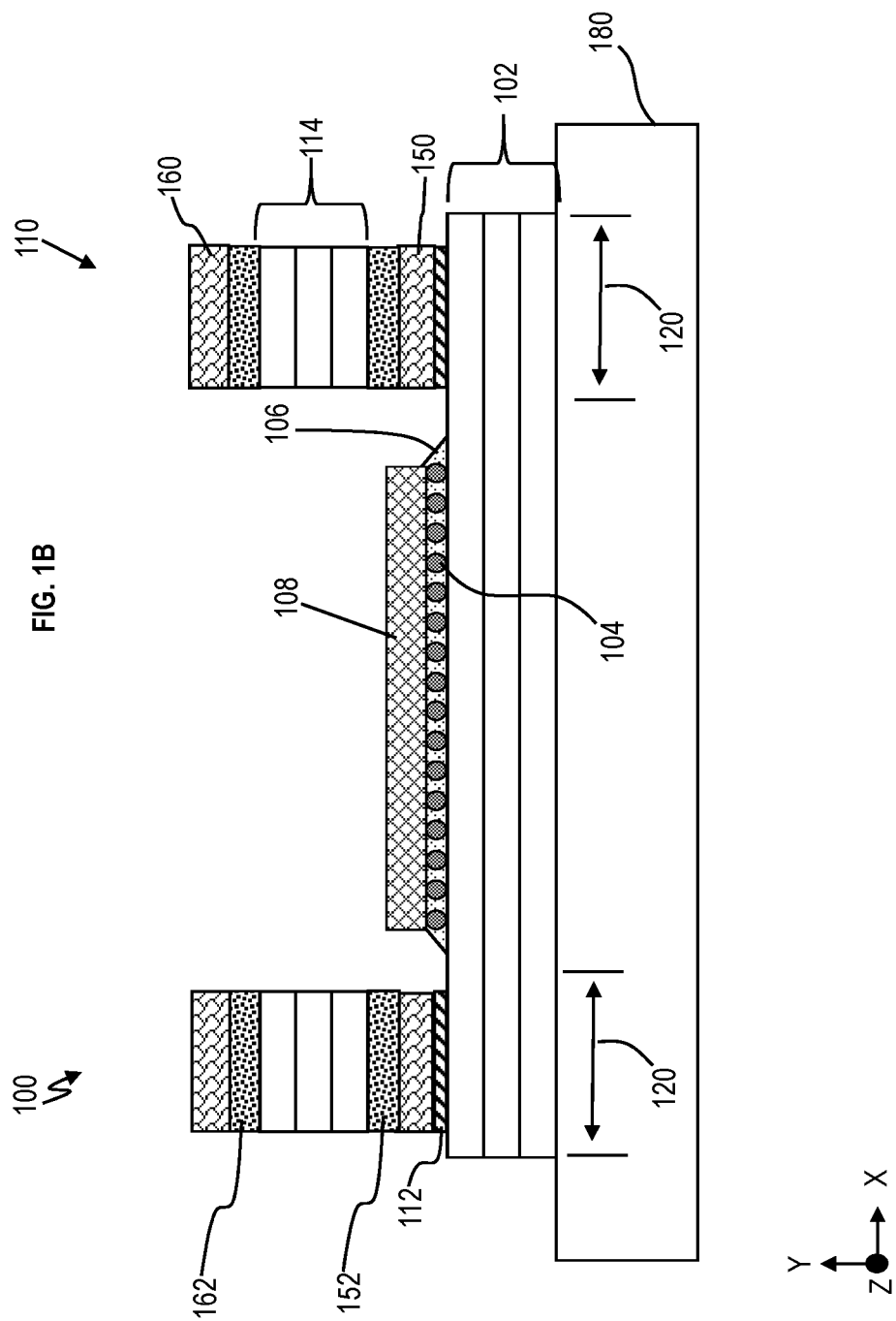

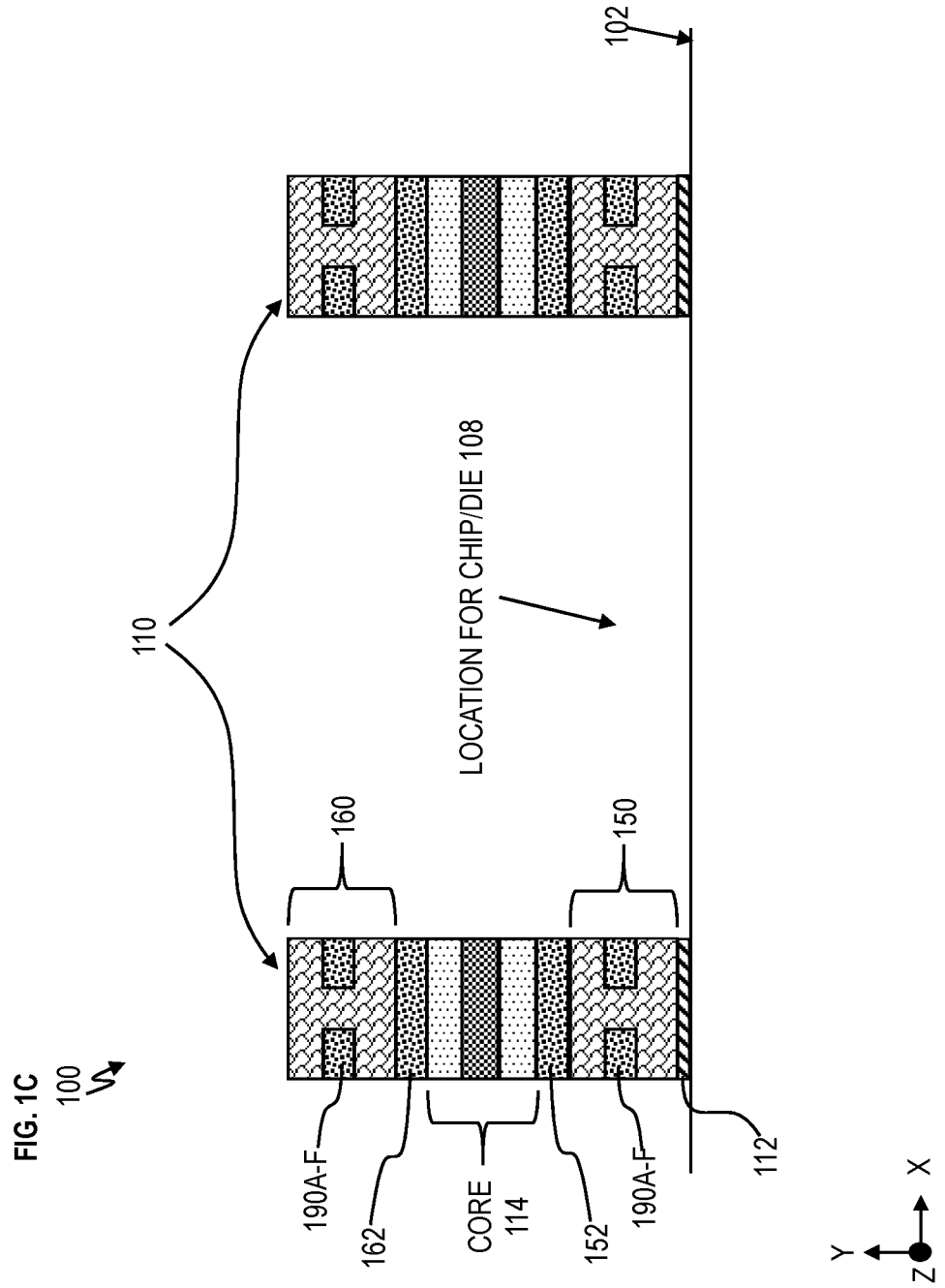

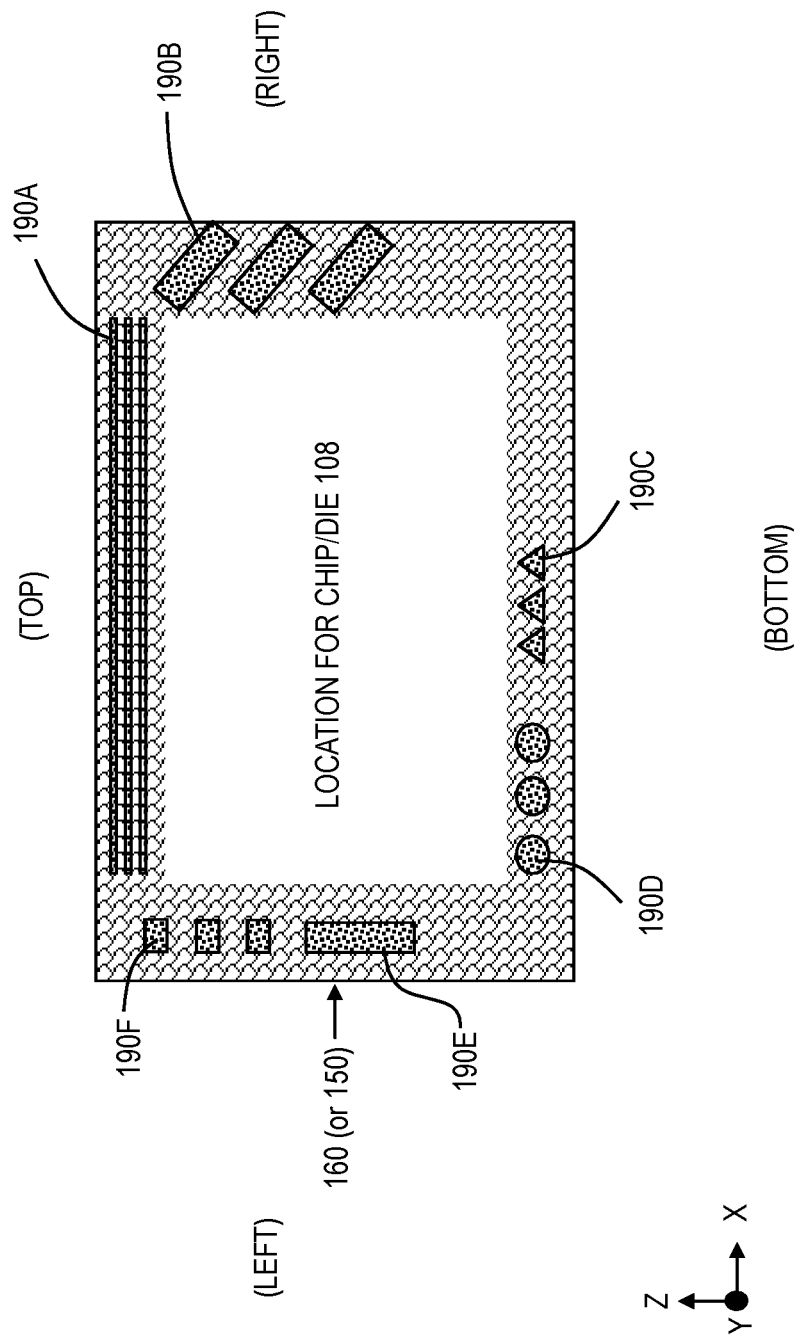

METHOD OF FORMING AN ELECTRONIC PACKAGE

BACKGROUND

The present invention relates generally to electronic chip carriers, and more specifically, to laminated stiffeners to control the warpage of electronic chip carriers.

Electronic chips are electrically connected to chip carriers, and chip carriers are connected to printed circuit boards to allow electrical paths for power and signals. It is important to control the warpage of the chip carriers for successful connection of the chip to the chip carrier and reduction of stresses in the electronic package components.

SUMMARY

Embodiments of the present invention are directed to an electronic package. Non-limiting examples of the electronic package include a substrate configured to receive a chip and a stiffener attached to the substrate. The stiffener includes a core material with a first material formed on opposing sides of the core material, where a coefficient of thermal expansion (CTE) of the stiffener and the substrate matches through a predefined range of temperatures.

Embodiments of the present invention are directed to a method of forming an electronic package. Non-limiting examples of the method include providing a substrate configured to receive a chip and attaching a stiffener to the substrate. The stiffener includes a core material with a first material formed on opposing sides of the core material, where a coefficient of thermal expansion (CTE) of the stiffener and the substrate matches through a predefined range of temperatures.

Embodiments of the present invention are directed to an electronic package. Non-limiting examples of the electronic package include a substrate configured to receive a chip, the substrate comprising a first coefficient of thermal expansion (CTE), where the substrate comprises a transition temperature. The electronic package includes a stiffener attached to the substrate. The stiffener includes a second CTE and includes a material property, where the first CTE and the second CTE substantially match, where the material property defines that the first CTE and the second CTE substantially match through the transition temperature.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1B depicts a cross-sectional view of an electronic package according to embodiments of the invention.

FIG. 1C depicts a cross-sectional view of an example stiffener to illustrate buildup layer and copper loading according to embodiments of the invention.

FIG. 1D depicts a top view of an example stiffener with various types of copper loading in and/or on top of a buildup layer according to embodiments of the invention.

Figure 1A:
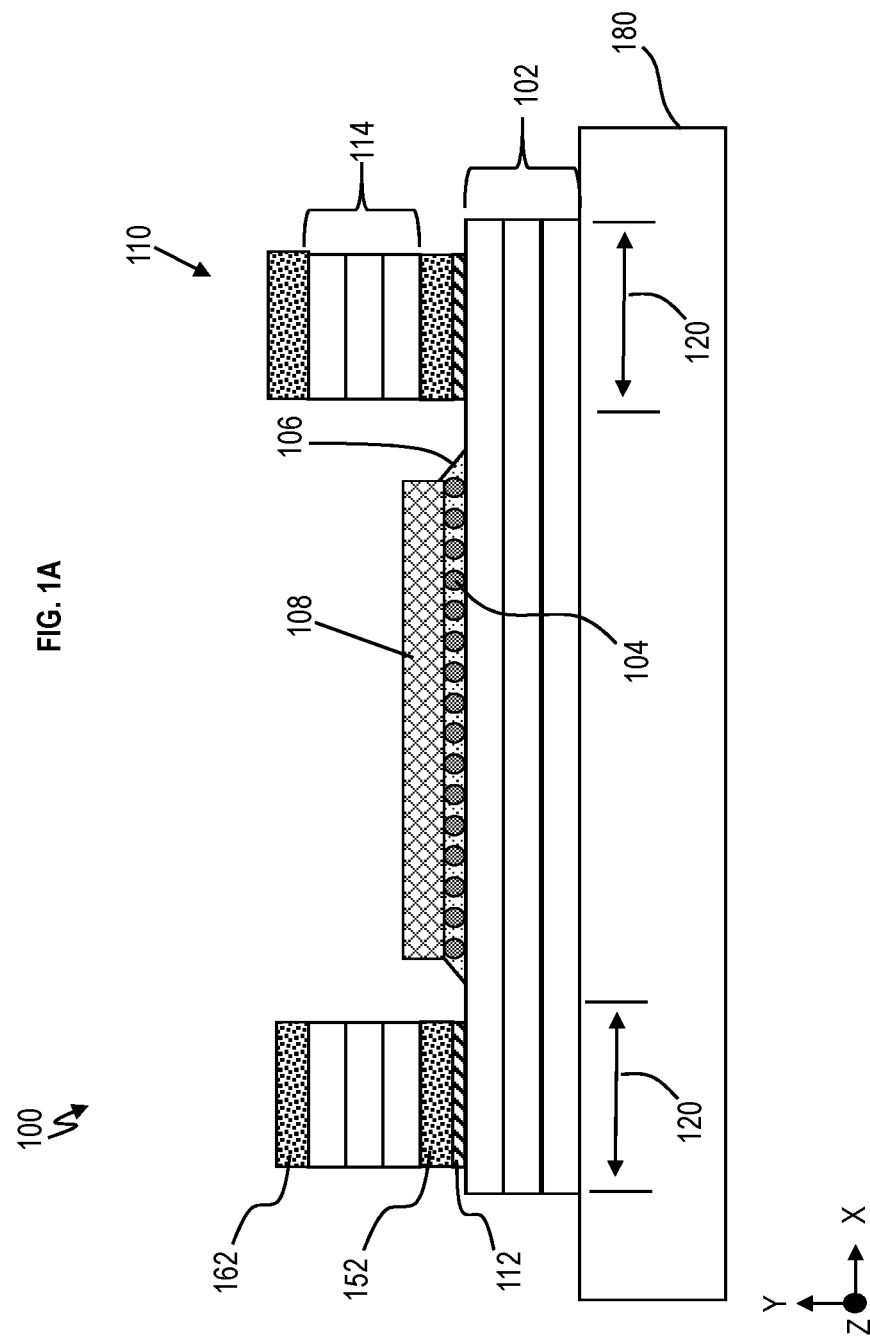
FIG. 1A depicts a cross-sectional view of an electronic package according to embodiments of the invention.

Additional technical features and benefits are realized through the techniques of the present invention. Embodiments and aspects of the invention are described in detail herein and are considered a part of the claimed subject matter. For a better understanding, refer to the detailed description and to the drawings.

DETAILED DESCRIPTION

Definitions are provided below:

The glass to liquid transition or glass transition for short is the reversible transition in amorphous materials (or in amorphous regions within semi-crystalline materials) from a hard and relatively brittle "glassy" state into a viscous or rubbery state as the temperature is increased. An amorphous solid that exhibits a glass transition is called a glass. The reverse transition, achieved by super cooling a viscous liquid into the glass state, is called vitrification. The glass-transition temperature (Tg) of a material characterizes the range of temperatures over which this glass transition occurs. The glass-transition temperature is always lower than the melting temperature of the crystalline state of the material if one exists.

FR-4 (or FR4) is a National Electrical Manufacturers Association (NEMA) grade designation for glass-reinforced epoxy laminate material. FR-4 is a composite material composed of woven fiberglass cloth with an epoxy resin binder that is flame resistant (self-extinguishing). "FR" stands for flame retardant and denotes that the material complies with the standard UL94V-0. The designation FR-4 was created by NEMA in 1968. FR-4 glass epoxy is a popular and versatile high-pressure thermoset plastic laminate grade with good strength to weight ratios. With near zero water absorption, FR-4 is most commonly used as an electrical insulator possessing considerable mechanical strength. The material is known to retain its high mechanical values and electrical insulating qualities in both dry and humid conditions. These attributes, along with good fabrication characteristics, lend utility to this grade for a wide variety of electrical and mechanical applications. Grade designations for glass epoxy laminates are G10, G11, FR4, FR5, and FR6. Of these, FR4 is the grade most widely in use today. G-10, the predecessor to FR-4, lacks FR-4's self-extinguishing flammability characteristics. FR-4 epoxy resin systems typically employ bromine, a halogen, to facilitate flame-resistant properties in FR-4 glass epoxy laminates. Some applications where the thermal destruction of the material is a desirable trait will still use G-10 non flame resistant.

Lamination is the technique of manufacturing a material in multiple layers so that the composite material achieves improved strength, stability, sound insulation, appearance or other properties from the use of differing materials. A laminate is a permanently assembled object by heat, pressure, welding, or adhesives.

Thermal expansion is the tendency of matter to change in shape, area, and volume in response to a change in temperature. Temperature is a monotonic function of the average molecular kinetic energy of a substance. When a substance is heated, the kinetic energy of its molecules increases. Thus, the molecules begin vibrating/moving more and usually maintain a greater average separation. The relative expansion (also called strain) divided by the change in temperature is called the material's coefficient of thermal expansion (CTE) and the expansion varies with temperature.

An elastic modulus (also known as modulus of elasticity) is a number that measures an object or substance's resistance to being deformed elastically (i.e., non-permanently) when a stress (mechanics stress) is applied to it. The elastic modulus of an object is defined as the slope of its stress-strain curve in the elastic deformation region. A stiffer material will have a higher elastic modulus. Specifying how stress and strain are to be measured, including directions, allows for many types of elastic moduli to be defined. Young's modulus (E) describes tensile elasticity or the tendency of an object to deform along an axis when opposing forces are applied along that axis; it is defined as the ratio of tensile stress to tensile strain. It is often referred to simply as the elastic modulus.

For the sake of brevity, conventional techniques related to semiconductor and/or superconducting devices and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor and/or superconducting devices and semiconductor/superconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, an electronic structure/package can include an electronic chip carrier, a semiconductor chip coupled to the electronic chip carrier through solder joints and a polymer material called underfill, and a stiffener adhesively attached to the electronic chip carrier. The stiffeners used in existing solutions in the state-of-the-art are composed of one material and/or are alloys with fixed modulus and fixed CTE. Thus, the drawback of the state-of-the-art stiffeners is that they are not optimized for controlling the warpage of the chip carriers.

Turning now to an overview of the aspects of the invention, one or more embodiments of the invention address the above-described shortcomings of the prior art by providing an alternate construction of a stiffener that is attached to the perimeter of the electronic chip carrier and reduces the warpage of the electronic chip carrier. Electronic chips are electrically connected to electronic chip carriers, and electronic chip carriers are connected to printed circuit boards to allow electrical paths for power and signals. It is important to control the warpage (i.e., flexing or bending) of the electronic chip carriers for successful connection of the chip to the electronic chip carrier and reduction of stresses in the electronic package components. As noted above, the stiffeners used in existing solutions in the state-of-the-art are composed of one material and/or are alloys with fixed modulus and CTE. Thus, the drawback of the state-of-the-art stiffeners is that they are not optimized for controlling the warpage of the chip carriers. However, embodiments of the invention provide a stiffener with a central core material and with copper foils on both sides of the central core. Additional dielectric and copper layers in any order can be provided on either (or both) sides of the copper foils. Vias can be drilled in the dielectric layers and plated (with a material such as, for example, copper). Additionally, copper (or other materials) can be deposited in different patterns on top of the dielectric layers by applying photoresist materials, exposing the photoresist materials is a predefined pattern, removing exposed portions of the photoresist materials, and depositing copper material. The photoresist material is stripped away after the copper is deposited, thereby leaving the copper is the predefined pattern. The thickness of the central core material, copper foil, and dielectric layers and the copper percentage (also called copper loading) are adjustable to match the CTE of the underlying electronic chip carrier and to increase the modulus of the composite stiffener over a range of temperatures.

Furthermore, embodiments of the invention provide a stiffener that matches the laminate CTE (of the underlying electronic chip carrier) with high modulus over a range of temperatures from the stiffener attach temperature to room temperature. The stiffener may be adhesively attached or soldered to the laminate top surface of the electronic chip carrier. To achieve this matched CTE over (a range of) temperatures with high modulus, the stiffener construction can be as follows: a) a core material with copper foils on both sides as depicted in FIG. 1A; b) a core material with copper foils on both sides and a number of dielectric and patterned copper layers on top and bottom of the copper foils as depicted in FIGS. 1B and 1C; c) the copper percentage in the dielectric layers is varied with different shapes and line lengths as depicted in FIGS. 1C and 1D; d) the thickness of each (copper) layer can be variable as discussed in FIG. 1D.

Turning now to a more detailed description of embodiments of the invention, FIG. 1A depicts a cross-sectional view of an electronic package 100 according to embodiments of the invention. FIG. 1B depicts a cross-sectional view of an electronic package 100 according to embodiments of the invention. The electronic package 100 has a substrate 102 or electronic chip carrier. The substrate 102 can be attached to a printed circuit board 180. The substrate 102 can be coupled to the printed circuit board 180 via solder material which is not shown so as not to unnecessarily obscure the figure. The substrate 102 is usually a laminate formed of multiple laminate layers. The terms substrate (or laminate) and electronic chip carrier may be interchangeably used. For example purposes, the substrate 102 is depicted with three layers. It should be appreciated that the substrate 102 can have fewer or more than three layers.

The substrate 102 (electronic chip carrier) includes all types of laminates that are typically utilized for electronic chip carriers as understood by one skilled in the art. The substrate 102 may be a high glass-transition temperature (Tg) epoxy multilayer material also known as an FR-4 material. The substrate 102 can be a woven fiberglass cloth with FR-4 material included. Furthermore, the substrate 102 can be laminate or organic substrates made with an epoxy and glass fiber/cloth stiff "core", on which circuits are built upon multiple layers on both sides, using dielectric films as insulators and copper wiring/patterning to generate the circuits. In particular, the substrate 102 (electronic chip carrier) is typically a laminated structure with a core, copper wiring, copper vias, and dielectric layers as understood by one skilled in the art.

A semiconductor chip or die 108 is attached to the substrate 102 by solder material 104. The solder material 104 can be solder balls, bumps, or pillars. The chip 108 can be a semiconductor chip designed to perform one or more functions. An underfill material 106 is filled in between the chip 108, the substrate 102, and the solder balls 104. The underfill material 106 can be, for example, an epoxy based material with Tg between 80° C. and 125° C.

A stiffener 110 is adhesively attached or soldered to the periphery 120 of the substrate 102 by an adhesive 112. The adhesive 112 can be a glue suitable for high temperatures. Embodiments of the invention provide novel ways of constructing the stiffener 110 such that the CTE of the stiffener 110 is controlled to match the CTE of the substrate 102 even as the temperature changes through a glass transition (Tg) temperature (e.g., 135° C. or more) of the substrate 102 and a reflow temperature of the solder material 104. The stiffener 110 is a laminate, which means that the stiffener 110 is composed of laminate materials. As noted above, the substrate 102 is a laminate composed of laminate materials. In one implementation, the laminate materials forming the stiffener 110 are the same as the laminate materials forming the substrate 102. For explanation purposes, the stiffener 110 is shown having three layers of laminate materials which are the same stack of laminate materials in the substrate 102. In this example, the stiffener 110 has a core 114 of laminate materials, and in this example, the core 114 of laminate materials is the same as the laminate materials in the substrate 102. Various ways of adding material to the core 114 are discussed herein. In some embodiments of the invention, the core 114 of laminate materials in the stiffener 110 can be different from the layers of laminate materials in the substrate 102. As noted above, the core 114 of the stiffener 110 can a high glass-transition temperature (Tg) epoxy multilayer material is also known as an FR-4 material, a woven fiberglass cloth with FR-4 material included, and/or a laminate or organic substrate made with an epoxy and glass fiber/cloth. The core 114 can be a polymer. A high glass-transition temperature (Tg) is defined as a range above 175° C.

In accordance with the core 114 of laminate materials in the stiffener 110 is the same as the laminate materials in the substrate 102, the stiffener 110 can be formed by cutting out a window frame for the stiffener 110 from the same laminate/substrate 102 to which the stiffener 110 is to be attached. Cutting out the window frame and/or other shapes for the stiffener 110 (piece or pieces) from the material of the substrate 102 can be accomplished by water jet cutting, punching, etc. The window frame stiffener 110 is composed of the same laminate materials as the substrate 102. The bottom surface of stiffener 110 (in the y-axis) is adhesively attached or soldered to the periphery 120 of the top surface of the substrate 102. In addition to the core 114 (which applies to both cases of the core 114 being the same laminate materials as the substrate 102 or different laminate materials from the substrate 102), the stiffener 110 can include a copper layer 152 on the bottom surface and a copper layer 162 on the top surface of the stiffener core 114 with respect to the y-axis, as depicted in FIG. 1A. Additionally, FIG. 1B shows the stiffener 110 can (optionally) include one or more other layers 150 and 160 built upon one or both sides (top and/or bottom in the y-axis) of the core 114 with respect to the y-axis.

In one implementation, the core 114 of the stiffener 110 may not be a laminate material. The layers 152 and 162 and/or layers 150 and 160 can be formed on opposing sides of the core 114 regardless of whether the core 114 is a laminate or not.

FIG. 1C depicts a cross-sectional view of the stiffener 110 to illustrate the dielectric buildup layers and copper loading layers according to embodiments of the invention. FIG. 1D depicts a top view of an example stiffener with various types of copper loading examples in and/or on top of a dielectric buildup layer according to embodiments of the invention.

FIG. 1C is a cross-sectional view illustrating an example of copper loading on the stiffener 110. For simplicity, FIG. 1C does not show the chip/die 108 or any details about the substrate 102. It should be appreciated that the chip/die 108 is attached or can be attached as discussed herein. FIG. 1C shows the stiffener core 114 with the copper layer 152 on the bottom surface and the copper layer 162 on the top surface with respect to the y-axis. The copper layers 152 and 162 are formed on opposite sides of the stiffener core 114. The copper layer 152 and 162 may be referred to as copper foils. The copper layers 152 and 162 can be deposited using typical deposition processes for copper, as understood by one skilled in the art. As an example, copper can be deposited by physical vapor deposition (PVD) (and reflow), by chemical vapor deposition (CVD), by electrochemical/galvanic processes, or by other deposition techniques understood by one skilled in the art.

FIG. 1C shows the buildup layer 150 formed on the bottom side of the core 114 (e.g., on the bottom surface of the copper layer 152) in the y-axis, and shows the buildup layer 160 formed on the top side of the core 114 (e.g., on the top surface of the copper layer 162) in the y-axis. The buildup layers 150 and 160 can include one or more of the copper shapes 190A-F (in any combination and/or any combined of sides with respect to the left, right, top, and/or bottom sides labeled in FIG. 1D), which can be embedded in the buildup layers 150 and 160 and/or on the (top of bottom) surface of the buildup layers 150 and 160.

In FIG. 1C, the copper shapes 190A-F are shown as embedded. This can be achieved by drilling (e.g., using a laser) the dielectric layers 150 and 160 with holes of different shapes and then plating the holes with copper, to thereby from copper shapes 190A-F. Optionally, more dielectric material can be deposited on top of the copper shapes 190A-F. Additional copper loading can be added to the stiffener 110 by depositing more copper shapes 190A-F on top of the dielectric buildup layer 160 and on the bottom of the dielectric buildup layer 150. The deposition of more copper shapes 190A-F can occur after applying and exposing a photoresist layer to create openings for the deposition. The photoresist layer can be stripped away after the deposition of the copper. As one example, the deposition of more copper shapes 190A-F can include depositing a photoresist material on top of the dielectric layer 150, 160, exposing the photoresist material in a desired/predefined pattern, removing the exposed portions of the photoresist material such that openings in the photoresist material uncover the dielectric layer 150, 160 underneath, depositing the copper material on the photoresist material and on the dielectric layer 150, 160 at the openings left from removing the exposed portions of photoresist material, and stripping the photoresist material from the dielectric layer 150, 106 (which concurrently strips any copper not in the openings) after the copper is deposited, thereby leaving the copper in the desired pattern (e.g., copper shapes 190A-F) on top of the dielectric layer 150, 160.

Also, further layers of buildup layers 150 and 160 can be added and further copper loading can be embedded in layers 150 and 160 and/or added to the surfaces of layers 150 and 160. The deposition (i.e., copper loading) of copper shapes 190A-F can continue and forming of additional buildup layers 150 and 160 can continue until the stiffener CTE of stiffener 110 matches the laminate CTE of substrate 102. Although only 1 example buildup layer 150 and 1 buildup layer 160 are shown, it should be appreciated that 2, 3, 4, 5, 6, . . . 10 or more buildup layers 150 and 160 can be utilized, where each of the buildup layers 150 and 160 have copper shapes 190A-F. The buildup layers 150 and 160 are utilized in a pair in the stiffener 110.

Further regarding FIG. 1D, an illustration is shown of one or more buildup layers 160 (or 150) of dielectric material which are on top of the stiffener core 114 (not shown in FIG. 1D), while one or more buildup layers 150 (not shown in FIG. 1D) of dielectric material are on the bottom of the core 114. FIG. 1D shows further details of copper loading by example copper shapes 190A, 190B, 190C, 190D, 190E, and/or 190F. The copper shapes 190A-F are formed of copper (Cu) material. The copper shapes 190A depict lines of copper material as the copper loading. As the copper loading, the copper shapes 190B depict rectangular shapes that may or may not have an offset angle with respect to the square-like or rectangular-like shape of the stiffener 110. The copper shapes 190C depict triangular shapes of copper material as the copper loading.

The copper shapes 190D depict circular shapes and/or oval shapes as the copper loading. As the copper loading, the copper shapes 190E depict rectangular shapes that are aligned to the stiffener 110. The copper shapes 190F depict square shapes as the copper loading. One of the copper shapes 190A-F and/or a combination of two or more different ones of the copper shapes 190A-F can be utilized in the same stiffener 110 to match the CTE of the (laminate) substrate 102.

In FIG. 1D, there are four sides of the stiffener 110 shown in the top view, which are the left and right sides in the x-axis and the top and bottom sides in the z-axis. The copper shapes 190A-F are not limited to their specific locations illustrated in FIG. 1D (which can be on both sides of the stiffener core 114) and can be formed anywhere on the stiffener 110. For example, the copper shapes 190A (and/or any copper shapes 190B-F) can be formed anywhere on the left, right, top, and/or bottom sides of the stiffener 110 to match the desired CTE of the substrate 102. There can be any combination of the copper shapes 190A-F on any combination of the left, right, top, and/or bottom sides with respect to the x-axis and z-axis. The copper shapes 190A-F can be formed on top of the buildup layer 160 and/or embedded within the buildup layer 160 (and/or 150). Also, the copper shapes 190A-F can be formed on top of the buildup layer 160 and/or embedded within the buildup layer 160 (and/or 150), in accordance with embodiments of the invention. The geometric shape, thickness, and area of the copper shapes 190A-F combine to affect the stiffener CTE of the stiffener 110 differently, so that two or more of the copper shapes 190A-F can be combined on the any of the sides of the stiffener 110 in order to contribute to the stiffener CTE (i.e., to match the CTE of the substrate 102). It should be appreciated that the stiffener 110 can include one or more type of the copper shapes 109A-F, two or more types of copper shapes 109A-F, three or more types of copper shapes 109A-F, four or more types of copper shapes 109A-F, five or more types of copper shapes 109A-F, etc., and the stiffener 110 can all types of the copper shapes 109A-F. Some of the same types of copper shapes, e.g., copper shapes 190A, can have different thicknesses in the y-axis, have a longer length line length in the x-axis, have a greater width in the z-axis. Even among the same type of copper shapes, e.g., copper shapes 190C, some copper shapes can have a larger size than another same type of copper shape. A selected combination of any of the copper shapers 190A-F can be combined to vary the copper percentage of the layer 160 (or 150) in order to achieve the desired stiffener CTE for the stiffener 110 (which matches the substrate CTE of the substrate 102).

Figure 2:
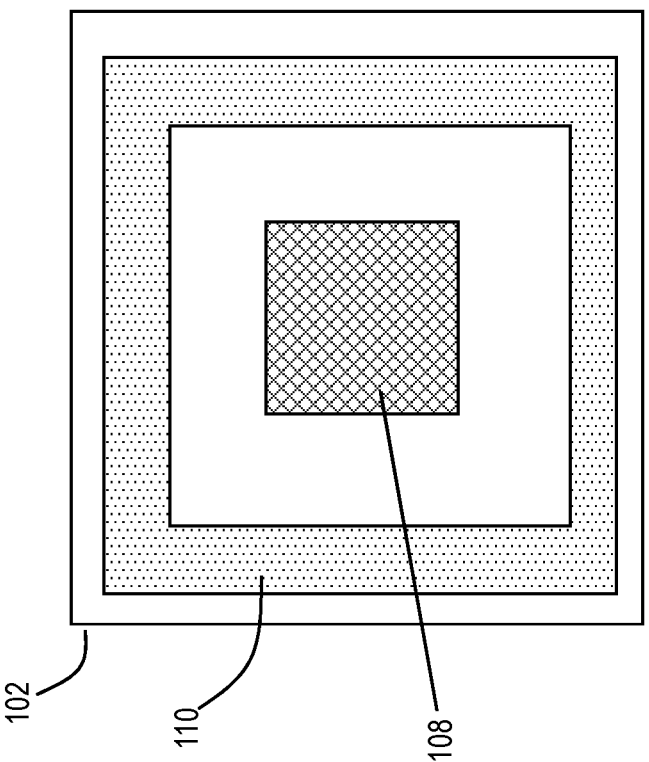
FIG. 2 depicts a simplified top view of the electronic package according to embodiments of the invention.
Figure 3:
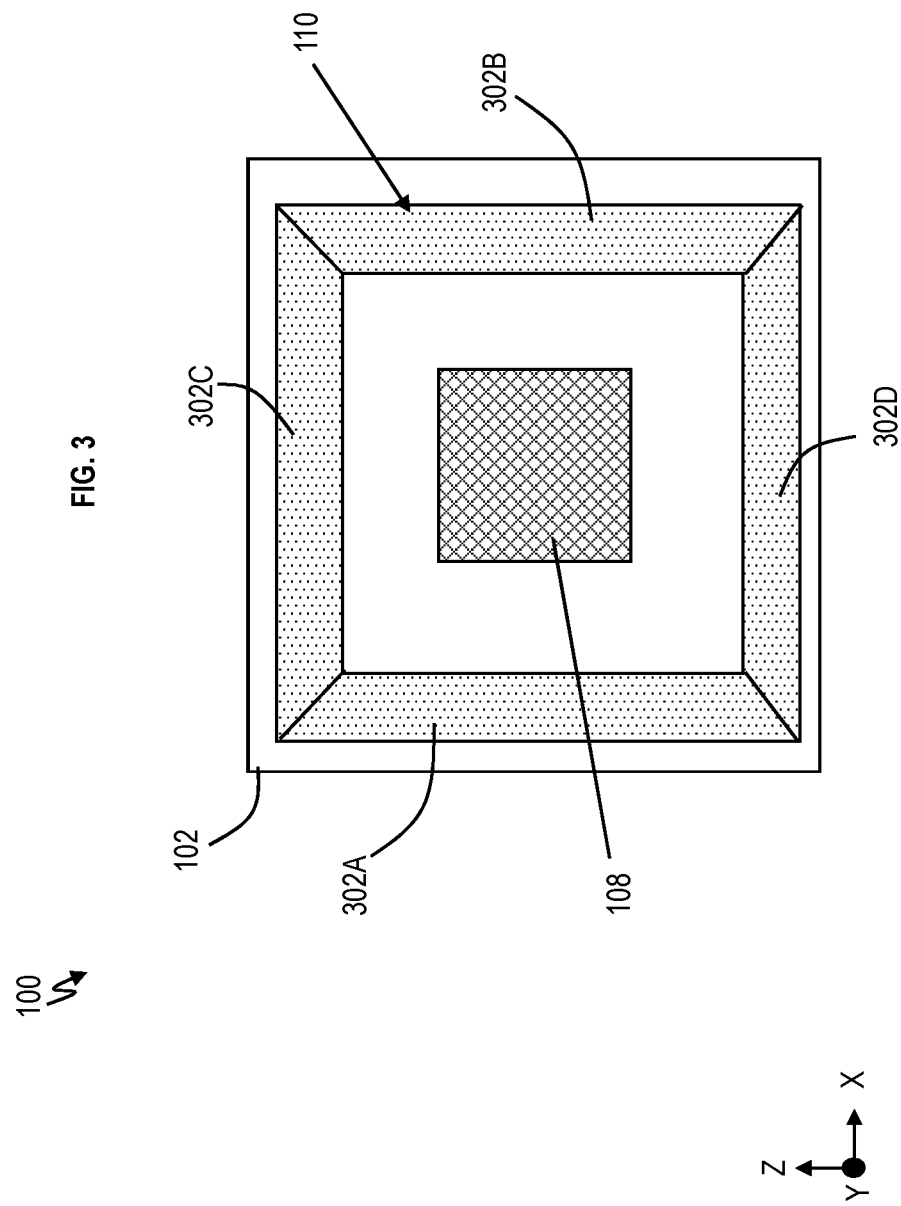
FIG. 3 depicts a simplified top view of the electronic package according to embodiments of the invention.

FIG. 2 depicts a simplified top view of the electronic package 100 according to embodiments of the invention. In this simplified view some details are omitted so as not to unnecessarily obscure the figure. For example, the printed circuit board 180 and the underfill material 106 are not illustrated. FIG. 2 shows the cut out window frame shape or annular picture frame for the stiffener 110 having been formed from the same laminate materials of the substrate 102 to which it is attached. For example, the core 114 of the stiffener 110 is the same stack of materials as the substrate 102 and can be cut out from the same composite of laminate materials that form the substrate 102. Additionally, the window frame shape of the stiffener 110 can be achieved by attaching four separate stiffener strips on each edge of the substrate 102 and gluing the four stiffener strips together to form a picture frame as depicted in FIG. 3. Also, the window frame like shape of the stiffener 110 can be achieved by attaching four strips on each edge of the substrate 102 and gluing the four stiffener strips (slightly spaced apart) on the substrate 102 as depicted in FIG. 4.

FIG. 3 depicts a simplified top view of the electronic package 100 according to embodiments of the invention. FIG. 4 depicts a simplified top view of the electronic package 100 according to embodiments of the invention. In simplified views, some details are omitted so as not to unnecessarily obscure the figure, and again, the printed circuit board 180 and the underfill material 106 are not illustrated.

Figure 4:
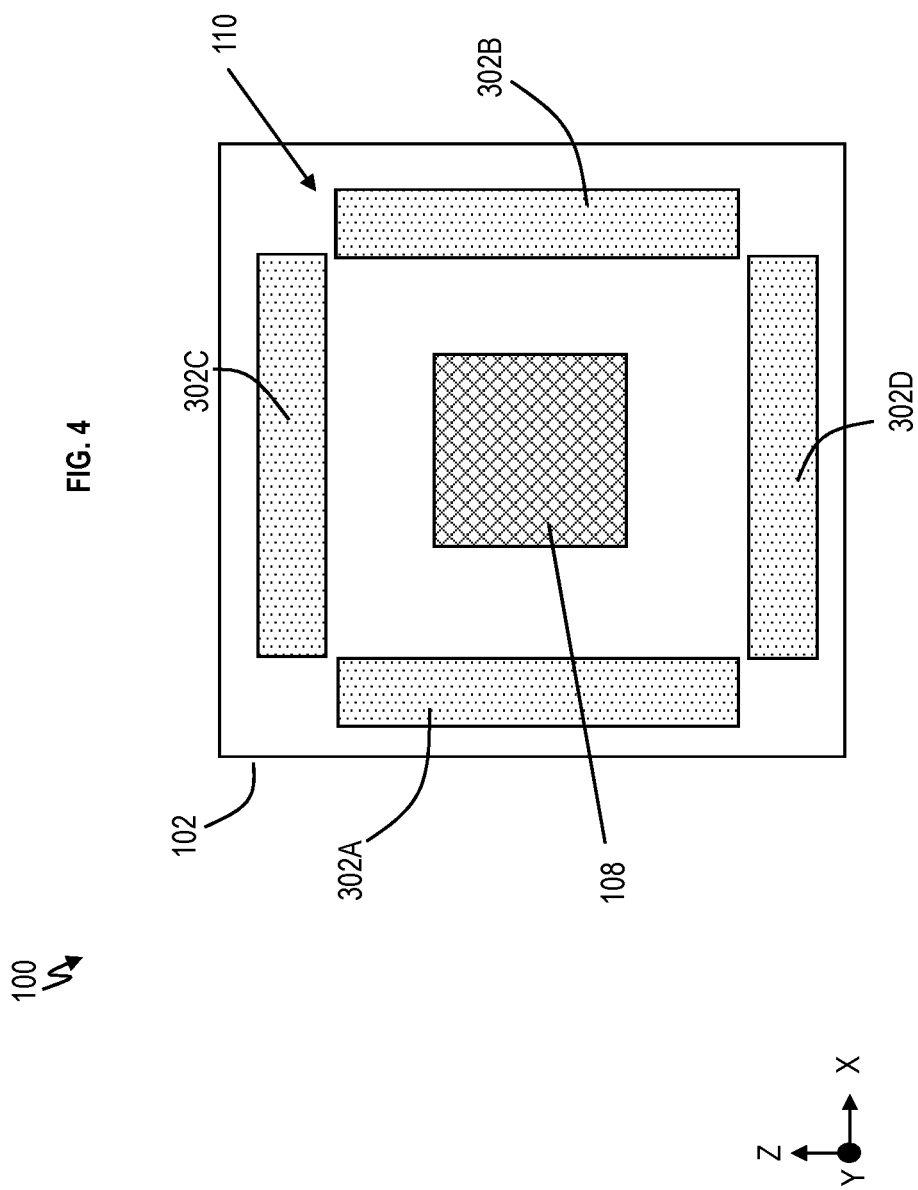
FIG. 4 depicts a simplified top view of the electronic package according to embodiments of the invention.

FIGS. 3 and 4 illustrate the stiffener strips 202A, 202B, 202C, and 202D of the stiffener 110. It should be appreciated that more or fewer stiffener strips may be utilized. Also, additional materials as discussed further herein can be utilized for the stiffener strips 202A, 202B, 202C, and 202D of the stiffener 110.

It is noted that the window frame shape can also be used when additional layers 150 and 160 are added to the core 114, which includes both cases of when the core 114 is the same or different from the materials of the substrate 102.

For ease of understanding in FIGS. 1A, 1B, 2, 3, and 4, the chip/die 108 is shown in the electronic package 100. However, the stiffener 110 is attached to the substrate 102 prior to attaching the chip 108 such that the stiffener 110 is present to prevent warpage of the substrate 102 during the chip join temperature (and before) when attaching the chip 108 with solder material 104.

The structural designs for the stiffener 110 discussed in FIGS. 1C and 1D can be utilized with any of the structural designs in FIGS. 1A, 1B, 2, 3, and 4. Turning back to the construction of the stiffener 110, there are various techniques for constructing the stiffener CTE of stiffener 110 to match (or nearly/substantially match within a predefined tolerance) the laminate CTE of the substrate 102, for both cases of when the core 114 is identical to the laminate materials of the substrate 102 and when the core 114 is different from the laminate materials of the substrate 102.

The materials of the stiffener 110 have a stiffener CTE that matches laminate CTE of the substrate 102, for example, in a range of 11-21 parts per million per degree Celsius (C) (ppm/C). The materials of the stiffener 110 are to maximize modulus while matching the laminate CTE of the substrate 102.

The variables to control the stiffener 110 include a Young's modulus of about 25-35 gigapascals (GPa) at room temp (e.g., about 25° C.). The core thickness of the core 114 of the stiffener 110 can range from about 0.1 to 1.2 millimeters (mm).

As noted herein the stiffener core 114 can be any of the example materials discussed herein including (identical or matching) laminate materials in the substrate 102, a high glass-transition temperature (Tg) epoxy multilayer material (also known as an FR-4 material), a woven fiberglass cloth with FR-4 material included, and/or a laminate/organic substrate made with an epoxy and glass fiber/cloth.

In the case when the core 114 is not the identical materials of the substrate 102 and/or when the core 114 has a different CTE from the substrate 102, the buildup dielectric CTE of the buildup layers 150 and 160 is higher than composite laminate CTE of the substrate 102 while core CTE of core 114 is lower than composite laminate CTE of the substrate 102. When the core CTE of core 114 and the buildup dielectric CTE of buildup layers 150 and 160 are combined, the total stiffener CTE of the stiffener 110 matches the laminate CTE of the substrate 102. The matching of the stiffener CTE of the stiffener 110 to the laminate CTE of substrate 102 is maintained at room temperature, through glass transition temperature of the substrate 102, and above glass transition temperature of the substrate 102. The combination CTE is matched at all temperatures. The stiffener CTE of stiffener 110 is structured to match the laminate CTE of the substrate 102 over a range of temperatures such as from about 25° C. to about 150° C.

The core material of the core 114 can have a core CTE range of 4-15 ppm/° C. (parts per million degrees Celsius). For example, the core CTE is between $4\text{-}15\times10^{-6}$/C which equivalent to 4-15 ppm/C. The buildup material of the buildup layers 150 and 160 can have a buildup dielectric CTE range of 16-30 ppm/° C. The copper loading of copper shapes 190A-F can have a copper loading percentage of 30-100%. The copper loading percentage is defined as the percentage of copper in that buildup layer (150 and 160).

The dielectric buildup layers 150 and 160 are insulating films. The buildup layers 150 and 160 can be oxides (for example silicon dioxide), nitrides (for example silicon nitride), etc. The stiffener 110 can contain all three materials which are the core materials of core 114, copper materials of copper layer 152, 162 and of copper shapes 190A-F, and dielectric materials of buildup layers 150, 160, and/or any subset of one or two materials. The thickness of each material in core 114, the copper layer 152, 162, the copper shapers 190A-F, and dielectric buildup layers 150, 160 can be varied to control the stiffener CTE and modulus of the stiffener 110. The thickness in the y-axis of each of the copper layers 152 and 162 can range from about 2 micrometers or microns (um) to 30 um. The thickness in the y-axis of each of the buildup layers 150 and 160 can range from about 6 um to 50 um. The thickness in the y-axis of each of the copper shapes 190A-F can range from about 0.5 mm to 10 mm. One copper shape can have first thickness, and another copper shape can have another thickness. Some copper shapes can have the same thickness while other copper shapes have different thicknesses. As noted above, the core thickness of the core 114 (e.g., polymer) can range from about 0.1 mm to about 1.2 mm.

Technical benefits of embodiments of the invention include tailoring CTE of the stiffener member over a range of temperatures by using, for example, a Cu-epoxy-Cu structure (e.g., copper layer 152/core 114/copper layer 162 structure), the CTE of which is tailored by the thickness of the different layers and the Cu content in the outer layers. Embodiments of the invention provide a composite stiffener which can be made of a central FR-4 core with copper foils on its top and bottom. Knowing the modulus and CTE of the chip carrier (e.g., substrate 102) in advance, the thickness of the core 114 and copper foils 152 and 162 are adjusted to tailor the modulus and CTE of the stiffener 110 such that the warpage of the chip carrier (e.g., substrate 102) is reduced at room and elevated temperatures (such as the join temperature of the chip 108) compared to that of a chip carrier without a stiffener.

The tailored stiffener allows lower warpage of the substrate 102 (or chip carrier) leading to chip attachment with reduction of open circuits and short circuits on the substrate 102 and lower stress in the package components such as controlled collapse chip connection (C4) solder balls and back-end-of-line (BEOL) elements.

Figure 5:
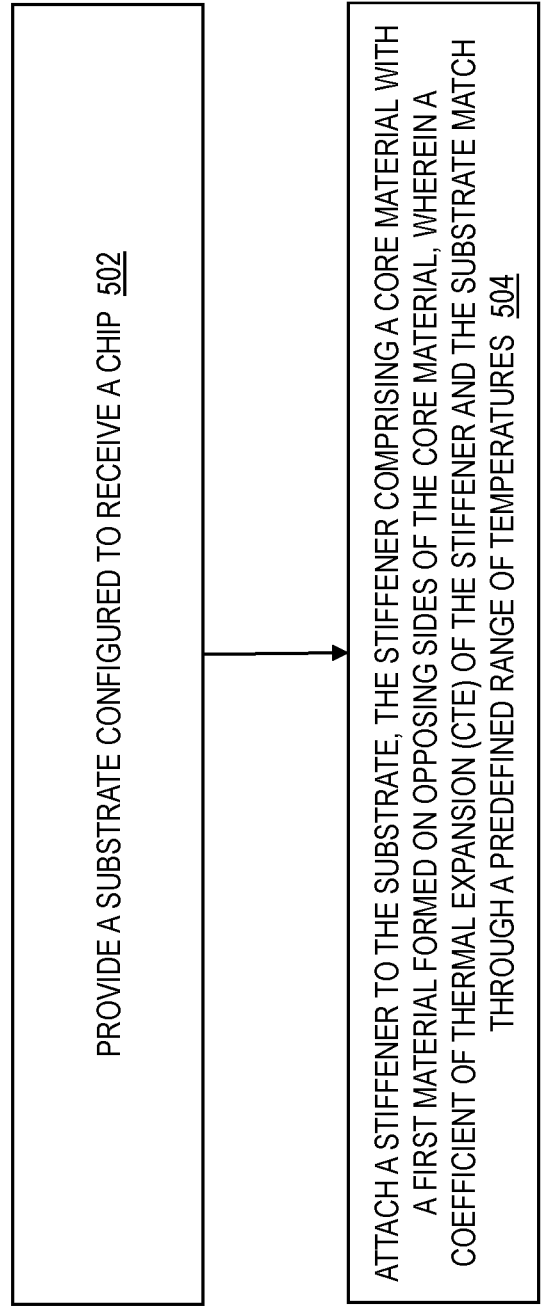
FIG. 5 depicts a flow chart of a method of forming an electronic package according to embodiments of the invention.

FIG. 5 depicts a flow chart 500 of a method of forming an electronic package 100 according to embodiments of the invention. At block 502, a substrate 102 is configured to receive a chip 108. At block 504, a stiffener 110 is attached to the substrate 102, the stiffener comprising a core material (e.g., core 114) with a first material (e.g., layers 152 and 162 and/or layers 150 and 160) formed on opposing sides of the core material (e.g., core 114), where a coefficient of thermal expansion (CTE) of the stiffener and the substrate matches through a predefined range of temperatures.

The core material (e.g., of core 114) comprises at least one material in the substrate 102. In one implementation, the core materials of the core 114 can be the exact same as the materials in the substrate 102. In another implementation, the core materials of the core 114 can include at least one material the same as the materials in the substrate 102, along with other materials that are different from the materials in the substrate.

The first material is copper. For example, the layers 152 and 162 are copper.

A second material is formed on the opposing sides of the core material (e.g., of core 114). The second material is a dielectric material. For example, a dielectric material of the buildup layers 150 and 160 can be formed on opposing sides of the core 114.

Vias are formed through second material, the vias being filled with the first material. For example, copper shapes 190A-F can be formed in the dielectric material of the buildup layers 150 and 160, by forming a shaped via and filling with copper material.

The coefficient of thermal expansion (CTE) of the stiffener 110 and the substrate 102 positively correlates (with each other) through the predefined range of temperatures. For example, the stiffener CTE of stiffener 110 can be the same or nearly the same as the CTE of the substrate 102, such that change of CTE ppm/° C. of the stiffener 110 is the same direction and at the same rate as the change of CTE ppm/° C. of the substrate 102 for each increase or decrease in degrees Celsius.

The vias are of different shapes such as, for example, copper shapes 190A-F. A patterned copper layer is formed on top of the dielectric material (e.g., buildup layers 150 and 160), which comprises: depositing a photoresist layer (not shown) on top of the dielectric material (e.g., buildup layers 150 and 160), exposing the photoresist layer in a predefined pattern, removing exposed portions of the photoresist layer such that openings in the photoresist layer uncover the dielectric material underneath, depositing copper material on the photoresist layer and on the dielectric material at the openings left from removing the exposed portions of photoresist layer, and removing the photoresist layer from the dielectric material, thereby leaving the patterned copper layer (e.g., copper shapes 190A-F) in the predefined pattern on the top (surface) of the dielectric material (e.g., buildup layers 150 and 160).

One or both sides of the core material 114 comprise a stack of copper layers (e.g., multiple copper foils 152, 162) and dielectric layers (multiple dielectric layers 150, 160) in any order of arrangement. The copper layers are of a variable thickness (e.g., copper layers can have different thicknesses within the stack) and the dielectric layers are of a variable thickness (e.g., the dielectric layers can have different thicknesses within the stack).

Figure 6:
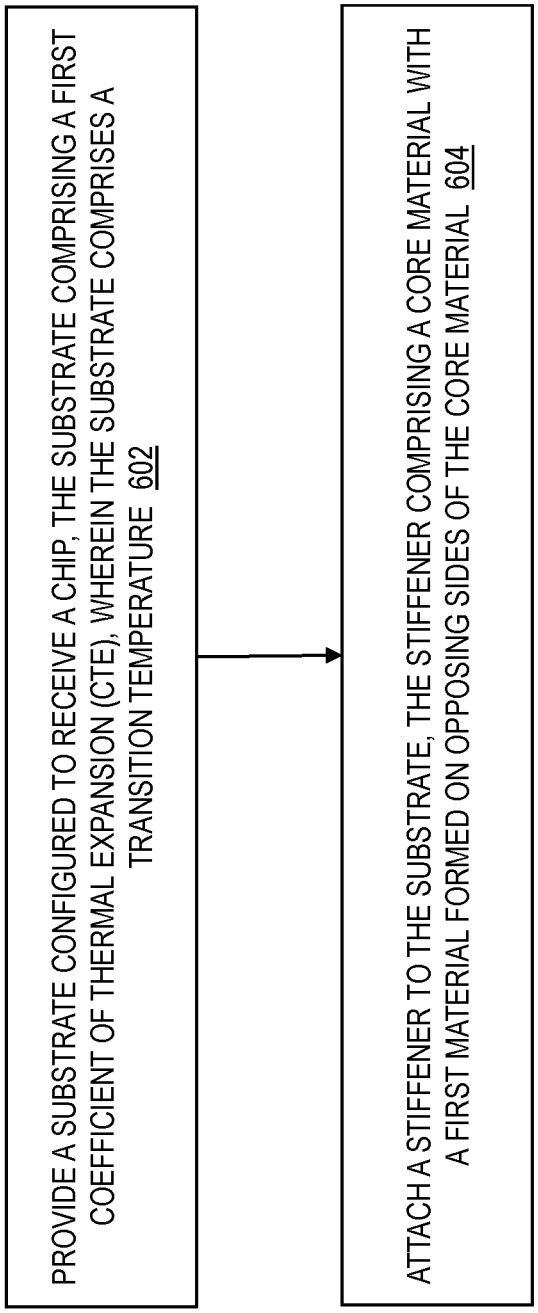
FIG. 6 depicts a flow chart of a method of forming an electronic package according to embodiments of the invention.

FIG. 6 depicts a flow chart 600 of a method of forming an electronic package 100 according to embodiments of the invention. At block 602, a substrate 102 is configured to receive a chip 108, where the substrate 102 comprises a first coefficient of thermal expansion (CTE) and comprises a first material property, wherein the substrate comprises a transition temperature. For example, the transition temperature is a glass transition temperature for the substrate 102.

At block 604, a stiffener 110 is attached to the substrate 102, where the stiffener comprises a second CTE and comprises a second material property, where the first CTE and the second CTE substantially match, wherein the material property defines that the first CTE and the second CTE substantial match through the transition temperature.

The first CTE and the second CTE are substantially matching from about a room temperature through about a reflow temperature. The reflow temperature is a temperature at which solder material is heated to couple the chip to the substrate. Reflow temperature can be generally between 140° C. to 245° C. depending on the solder material used.

The stiffener 110 is attached to at least a part of a periphery of the substrate 102. The stiffener 110 comprises at least one material in the substrate 102. In one implementation, the stiffener can be formed of identical materials as the substrate 102.

The substrate 102 comprises materials, and the substrate is formed as a laminate of the materials. The stiffener 110 comprises the same laminate materials that form the substrate 102.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilizes a variety of individually known physical and chemical processes performed on a semiconductor over a dielectric (e.g., silicon) substrate, some of which are described in the immediately following paragraphs.

In general, the various processes used to form a microchip that will be packaged into an IC fall into general categories, including, film deposition, removal/etching, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Films of both conductors (e.g., poly-silicon, aluminum, copper, etc.) and insulators (e.g., various forms of silicon dioxide, silicon nitride, etc.) are used to connect and isolate components. Lithography is the formation of three-dimensional relief images or patterns on the semiconductor substrate for subsequent transfer of the pattern to the substrate. In lithography, the patterns are formed by a light sensitive polymer called a photo-resist. To build the complex structures of a circuit, lithography and etch pattern transfer steps are repeated multiple times. Each pattern being printed on the wafer is aligned to the previously formed patterns and slowly the conductors, insulators and other regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an electronic package, the method comprising:
   providing a substrate configured to receive a chip, the substrate comprising a laminate stack, the substrate comprising a first surface opposite a second surface; and
   attaching a stiffener to the first surface of the substrate such that the second surface of the substrate is free of the stiffener, the stiffener comprising a core material with a first material formed on opposing sides of the core material, wherein a coefficient of thermal expansion (CTE) of the stiffener and the substrate matches through a range of temperatures, the core material of the stiffener comprising a core laminate stack matching the laminate stack of the substrate.

2. The method of claim 1, wherein the first material is copper.

3. The method of claim 2, wherein vias are formed through second material, the vias being filled with the first material.

4. The method of claim 3, wherein the vias are of different shapes.

5. The method of claim 1, wherein a second material is formed on opposing sides of the core material.

6. The method of claim 5, wherein the second material is a dielectric material.

7. The method of claim 6, further comprising forming a patterned copper layer on top of the dielectric material, which comprises:
   depositing a photoresist layer on top of the dielectric material;
   exposing the photoresist layer in a predefined pattern;
   removing exposed portions of the photoresist layer such that openings in the photoresist layer uncover the dielectric material underneath;
   depositing copper material on the photoresist layer and on the dielectric material at the openings left from removing the exposed portions of photoresist layer; and
   removing the photoresist layer from the dielectric material, thereby leaving the patterned copper layer in the predefined pattern on top of the dielectric material.

8. The method of claim 1, wherein one or both sides of the core material comprise a stack of copper layers and dielectric layers in any order of arrangement.

9. The method of claim 8, wherein the copper layers are of a variable thickness and the dielectric layers are of a variable thickness.

10. The method of claim 1, wherein the CTE of the stiffener and the substrate positively correlates through the range of temperatures.

11. The method of claim 1, wherein the laminate stack forming the substrate is a single laminate stack.

12. The method of claim 1, wherein the substrate is a single structure.

* * * * *